(12) United States Patent
Miske et al.

(10) Patent No.: US 6,774,675 B1
(45) Date of Patent: Aug. 10, 2004

(54) BUS HOLD CIRCUIT WITH POWER-DOWN AND OVER-VOLTAGE TOLERANCE

(75) Inventors: Myron J. Miske, Newfields, NH (US); Stephen B. Lombard, Gorham, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/602,798

(22) Filed: Jun. 24, 2003

(51) Int. Cl.[7] ............................................. H03K 19/0175
(52) U.S. Cl. ............................. 326/81; 362/83; 362/30; 362/86; 327/333
(58) Field of Search ............................. 326/81, 86, 30, 326/83; 327/333

(56) References Cited

U.S. PATENT DOCUMENTS

| | | | | |
|---|---|---|---|---|
| 5,431,462 A | * | 7/1995 | Lignell | 292/336.3 |
| 5,903,180 A | * | 5/1999 | Hsia et al. | 327/333 |
| 6,097,229 A | * | 8/2000 | Hinterscher | 326/86 |
| 6,150,845 A | * | 11/2000 | Morrill | 326/81 |
| 6,172,519 B1 | * | 1/2001 | Chiang et al. | 326/82 |
| 6,184,715 B1 | * | 2/2001 | Catanzaro et al. | 326/81 |
| 6,185,256 B1 | * | 2/2001 | Saito et al. | 326/20 |
| 6,191,607 B1 | * | 2/2001 | Meng et al. | 326/83 |

* cited by examiner

Primary Examiner—Michael Tokar
Assistant Examiner—Lam T. Mai
(74) Attorney, Agent, or Firm—Cesari and McKenna, LLP; Edwin H. Paul, Esq.

(57) ABSTRACT

A bus hold circuit of CMOS components that draws no DC current and is over voltage tolerant is described. No leakage current is drawn from the input when the input voltage is greater than the bus hold circuit supply voltage. A feedback inverter is used to s latch the Vin logic in the bus hold circuit. When Vin is low, it turns on a first switch that drives the gate of a PMOS switch low turning it on. The PMOS switch connects the power connection of the feedback inverter to Vcc. The gate remains low, keeping the PMOS switch turned on as Vin increases. The first switch is turned off, but the gate of the PMOS switch remains low, until Vin exceeds Vcc. At that point, a comparator drives the gate of the PMOS to Vin shutting the PMOS switch off. An arbiter circuit selects the higher of Vcc and Vin to bias the N-well of the PMOS switch and other PMOS components in the comparator and arbiter circuit. This biasing ensures that the N-wells are never forward biased, thereby preventing leakage from the Vin.

7 Claims, 3 Drawing Sheets

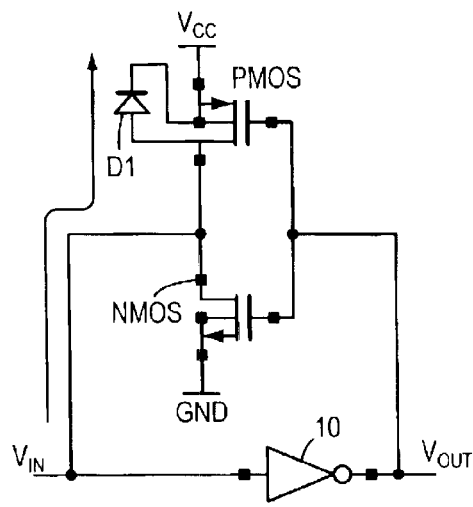
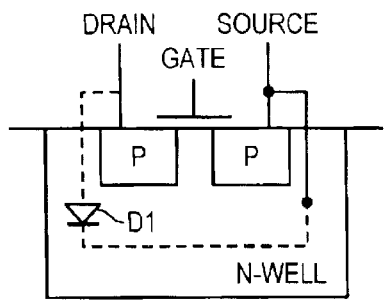
FIG. 1A PRIOR ART
FIG. 1B PRIOR ART
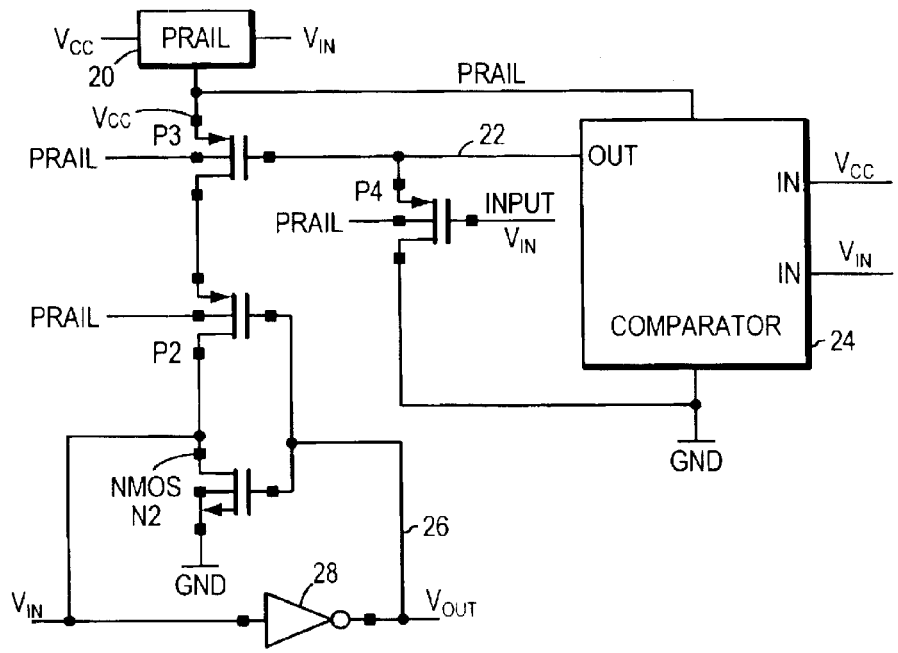
FIG. 2

BUS HOLD CIRCUIT WITH POWER-DOWN AND OVER-VOLTAGE TOLERANCE

BACKGROUND OF THE INVENTION

1. Field of the Invention

The present invention relates to bus driver circuits and more particularly to bus hold circuits that maintain the output logic state when the source of the input signal assumes a high impedance state; and more particularly to CMOS bus hold circuitry that is over voltage tolerant, that does not create a leakage path when powered down, and is frugal of DC power and components.

2. Background Information

Traditional bus hold circuits latch data from an input connection while providing a high impedance load on the input connection. Older bus hold circuits have neither power-down nor over-voltage tolerance and faulty or unacceptable conditions may occur under such circumstances. Over voltage will occur when, for example, a +5 volt logic system interfaces with a +3.3 V system, or transiently when severe input signal over-shoots occur. Power down situations happen when a portion of a system is unpowered, say for maintenance purposes, or to conserve battery life. In such occurrences, leakage currents may unacceptably load the input signal. Such limitations are addressed by the present invention.

FIG. 1A illustrates one limitation of the prior art circuits. The circuit inverter output is connected back via an inverter, PMOS and NMOS, to latch and thereby hold the input data. But, from inspection when the input signal is driven from a +5V logic level but the Vcc is +3.3V (or +1.8V) a leakage path exists through the drain to N-well diode, illustrated as D1. If the input voltage exceeds the Vcc, undesirable current will be drawn from the input signal connection and the latch circuit may malfunction. FIG. 1B shows the N-well to source leakage path in a sectioned view of a PMOS device, the leakage diode represented by D1.

Others have addressed some shortcomings of prior art bus hold circuits. U.S. Pat. No. 5,828,233 to Nguyen et al. (Nguyen) describes a circuit that provides both power-down and over-voltage protection tolerance. Nguyen employs passive components and two diode connected NMOS transistors arranged parallel anode to cathode, N3 and N4. Each of these diode connected transistors display about a 0.6V drop that have to be over-come before the circuit responds. Since the diodes are in parallel there is about a 1.2V zone (from one diode being on to the other diode being on) where the circuit operation is undetermined, ambiguous and asymmetrical. This 1.2V range is unacceptable. Asymmetrical is defined herein to mean that operation of the bus hold circuit displays markedly different delay/drive/noise level parameters under different input drive signals.

U.S. Pat. No. 6,097,229 to Hinterscher (Hinterscher) describes a circuit that is power-down tolerant but has no power-up or over-voltage tolerance.

U.S. Pat. No. 6,150,845 to Morrill (Morrill), which is commonly owned with the present application, describes a bus hold circuit with both power-down, over-voltage tolerance, and that prevents leakage from the input/output pins. But, the circuit undesirably contains many devices and consumes DC power in order to sense the over-voltage occurrence.

The Nguyen, Hinterscher and Morrill patents are each incorporated herein by reference.

It is an objective of the present invention to provide a bus hold circuit for use in computer, communications, interfacing and generally in virtually any digital system where symmetrical operation is desirable, and where such digital systems exhibit: power-down and over-voltage tolerance; economy of devices; and virtually no DC power consumption.

SUMMARY OF THE INVENTION

In view of the foregoing background discussion, the present invention provides a bus hold circuit, powered from Vcc, that addresses the limitations of the prior art.

The invention provides a CMOS inverter with a latching feedback inverter that includes a first PMOS device that selectively powers the second inverter. The N-well of this first PMOS device is connected to a pseudo power rail or prail. An arbiter circuit connects the more positive of the input voltage or the Vcc to the prail. This arrangement prevents the drain to N-well junction of this first PMOS device from becoming forward biased if Vin exceeds Vcc.

A comparator circuit provides a control signal of Vin, when Vin is at a higher potential than Vcc. The comparator circuit disconnects the control signal allowing it to float when Vcc is higher. When Vin is low, a second PMOS switch pulls the control signal low.

The N-wells of the PMOS devices in the bus bold circuit are connected to the prail provided by the arbiter circuit so that none of the PMOS devices will form a leakage path when Vin exceeds Vcc.

The comparator circuit, the first PMOS device, and the second PMOS switch acting together with the entire bus hold circuitry reduce the window of uncertainty between Vcc and Vin to about 100 millivolts.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which:

FIG. 1A is; a circuit block diagram of prior art bus hold circuitry;

FIG. 1B is a simplified section of a PMOS showing the leakage diode;

FIG. 2 is a block diagram of an embodiment of the present invention; and

DETAILED DESCRIPTION OF AN ILLUSTRATIVE EMBODIMENT

Figure 3:
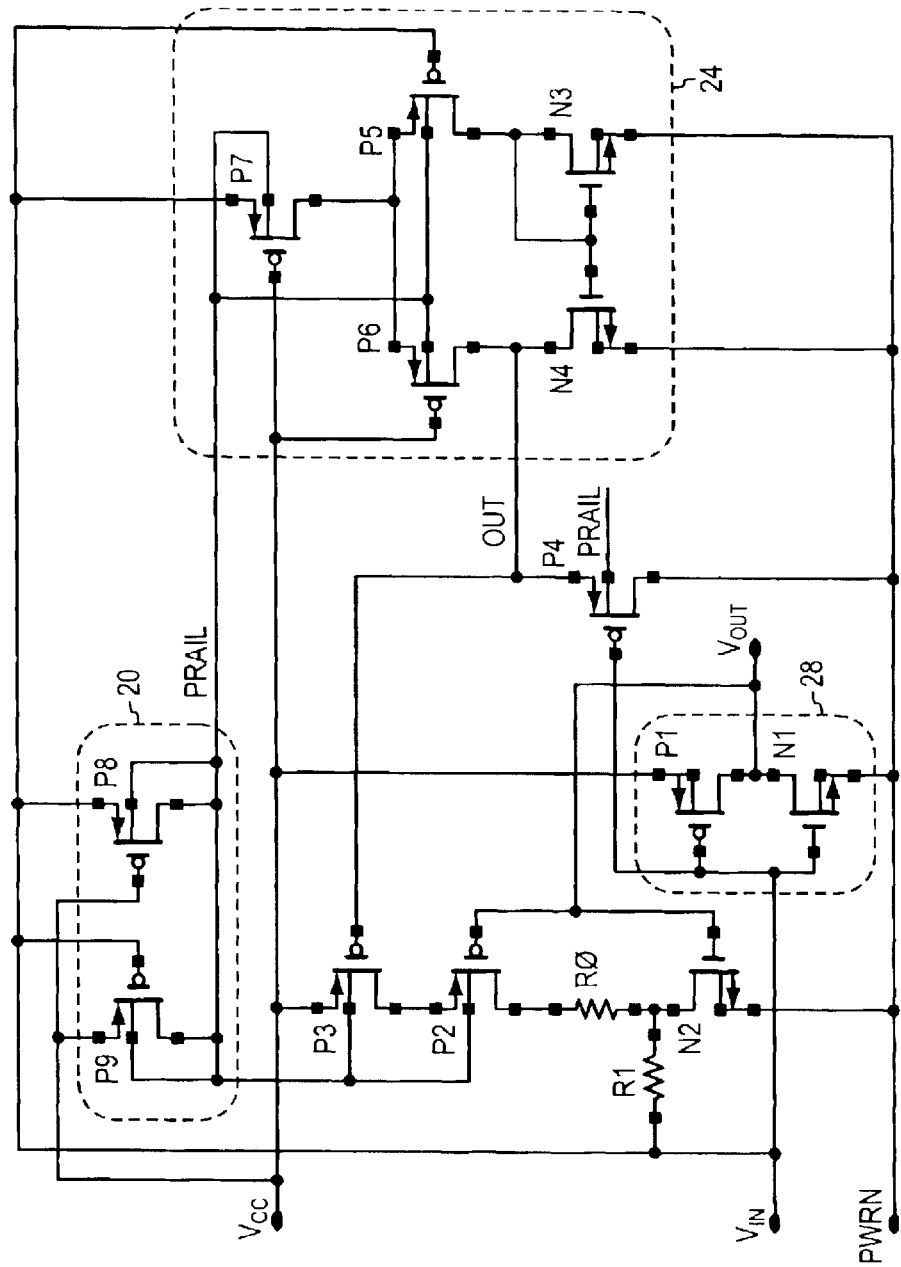
FIG. 3 is a more detailed schematic of FIG. 2.

FIG. 2 in block form illustrates the approach of the present invention. In this circuit a separate power connection, referred to as a prail, is arranged to power part of the circuitry of the bus hold with the higher of Vin or Vcc as determined from the prail arbiter circuit 20 as discussed below. In this block diagram P3 connects Vcc to the latching inverter made up of N2 and P2. When Vin exceeds Vcc, P3 is turned off and prevents leakage current from flowing from Vin to Vcc as described with respect to FIG. 1A. Notice that the prail provides power only to the N-wells of the PMOS transistors which removes the leakage path from Vin to Vcc when Vin is larger than Vcc.

With respect to FIG. 2, three conditions are examined:

First, the "normal" condition when Vin is at a logic low. In this condition Vcc appears on the prail through the arbiter circuit 20; P4 is turned on driving the gate of P3 low turning it on. Vcc powers the feedback inverter comprising P2 and N2 via the source of P2. Under this condition, the comparator 24 is off and the OUT signal is "floating" or un-driven with respect to the comparator circuit (as discussed below). The inverter 28 output, Vout, 26 is high, N2 is on latching Vin low through R1. This latch preserves the data in the bus hold circuit in the case of the circuitry sourcing Vin assumes a high impedance condition. If Vin goes high, but still lower than Vcc and the PMOS thresholds, the inverter output 26 goes low turning on P2 and off N2. Vcc appears at the drain of P2 via P3 and latches the circuit high via R0 and R1. Again the latch information is preserved if the input enters the high-impedance state.

Second, consider that Vin now rises until Vin about equals but does not exceed Vcc. Prail remains at Vcc, the comparator remains off, P4 is off, but P3 remains on. P3 remains on because its gate was held low by P4, the OUT signal 22 remains a high impedance, and so there is nothing to provide charge to the P3 gate capacitance. P3 gate remains low maintaining P3 on and Vcc still powers the feedback inverter.

Third, consider Vin rising to exceed Vcc. In this condition Vin appears on the prail via the prail arbiter circuit 20. The comparator now turns on driving the OUT signal to Vin. Vin appears at P3's gate turning P3 off disconnecting the source of P2 from Vcc. But, importantly compared to the leakage path illustrated in FIG. 1, the N-wells of the PMOS transistors are maintained at Vin levels such that no N-well to source junction is forward biased. In such a condition the leakage path will not exist. If Vcc goes to 0V, there will be no leakage path when a Vin signal (greater than 0V) appears.

FIG. 3 is a more detailed circuit schematic of FIG. 2. The arbiter circuit 20 of P8 and P9 drive the prail. N1 and P1 form the inverter 28, and P2, N2 form the feedback or latching inverter driving Vin via R0 and R1. Note that R0 and R1 are not needed for proper operation, but it has been found, that R0 and R1 act to make the operation of the bus hold buffer more symmetrical. The comparator circuit is shown in more detail. In the first conditions mentioned just above, when Vin is a logic low (less than Vcc) the comparator circuit 24 is off and the OUT signal is undriven (a high impedance) from the comparator. In such a condition, Vout is high and holds Vin low via the inverter P2/N2.

In the second condition mentioned above, when Vin rises to about equal to but not exceed Vcc, the comparator remains off and OUT is undriven. The Vout signal is low which turns on P2. P3 gate remains low, and Vin is pulled high to Vcc through R1, R0, P2 and P3.

Still referring to FIG. 3, in the third condition described above, where Vin is greater than Vcc, the comparator is described as being on where the drain of P6 and the gate of P3 are at Vin. Here P6 and P7 are on and will draw some small current via Vin to charge the capacitance at the drain of P6 up to Vin. P4 is off, since its gate and source are both at Vin, and P3 is off since its gate is at Vin and its source is at the lower voltage Vcc. Vout goes low via N1, turning on P2. Since Vin is higher than Vcc, prail is at Vin and the N-well of P3 is at Vin, so the N-well diode of P2 is not turned on. In this case the drain of P3 will be driven to Vin via R1 and R0.

In the prail arbiter circuit 20, P8 and P9 have common signals on the gate of one and the source of the other, in a cross coupled manner. Notice that the N-well of each PMOS is connected to the drain. This will maintain the voltage at the drains via the source to N-well diodes of either PMOS at a diode drop maximum below the higher lo source voltage. But, if either Vcc or Vin is lower than the threshold of the relevant PMOS, P8 or P9, the higher of Vcc or Vin will be presented with no diode drop at the prail. Of note, is that there are no components that draw DC current from the prail. So, if the prail is at Vcc via P9, and P9 is turned off by Vin rising, prail remains at Vcc. Similarly if prail is at Vin via P8, it will remain there.

Still referring to FIG. 3, the comparator circuit 24 includes PMOS P5, P6, P7 and NMOS N3 and N4. When in the first and the second conditions above, the comparator is described as being off. In the first condition P4 is on holding the drain of P6 low, and the drain of P6 remains so after P4 is off. In the second condition, consider Vcc and Vin to be about equal. Here P5, P6, and P7 are all effectively open circuits drain to source, as are N4 and N5. This contrasts to the circuit in Morrill where the comparator always draws DC current. Morrill's M14 is always on as is M12, and an independent power supply V1 is provided. In the condition where Vin and Vcc are near each other, the arbiter circuit and comparator circuit act to reduce the window of uncertainty to about 100 millivolts. There is substantially less uncertainty than the 1.2 volts equivalent condition in the Nguyen invention. Note that this 100 millivolt range does not interfere with the proper action of the bus hold circuit itself, and once the Vin/Vcc differential exceeds this 100 millivolts the higher one will dominate the voltage levels in the circuit.

Figure 4:
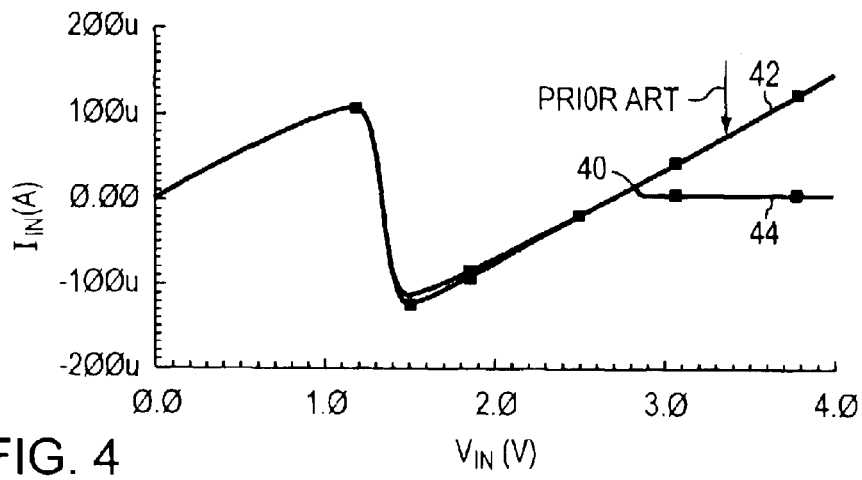
FIGS. 4 and 5 are input current versus voltage trace comparing the prior art and the present invention.

In any condition that Vin exceeds Vcc, for example if Vcc power is lost, Vin will appear at the prail via P8, the comparator is on and Vin will appear at the OUT terminal via P7 and P6. In this condition Vin via the prail connects the N-wells of all the PMOS transistors (except inverter P1 PMOS where it is not needed), thereby preventing the N-well to sources of these PMOS transistors from providing a leakage path from Vin to Vcc FIG. 4 compares Iin/Vin traces 42 and 44 for the circuits in FIG. 1 and FIG. 3, respectively, with Vcc set to +3.0 V. Notice that when Vin exceeds Vcc 40, the Iin 42 for the circuit of FIG. 1 continues to rise, due to the leakage path discussed above, while fin 44 remains substantially at 0.00A for the inventive circuit of FIG. 3.

Figure 5:
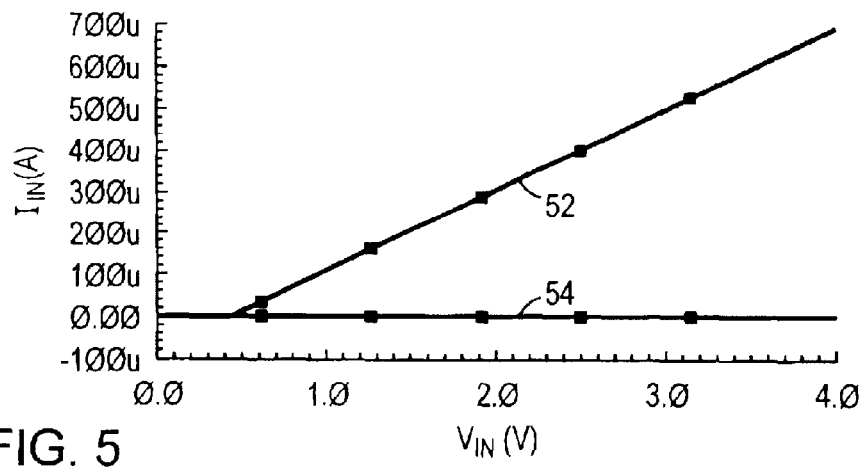

FIG. 5 compares Iin and Vin for the same circuits with Vcc at 0.0V. Here when Vin exceed the MOS threshold of about 0.5V the circuit in FIG. 1 draws current 52 (again via the leakage path discussed above) while the circuit of FIG. 3 draws none 54.

Figure 6:
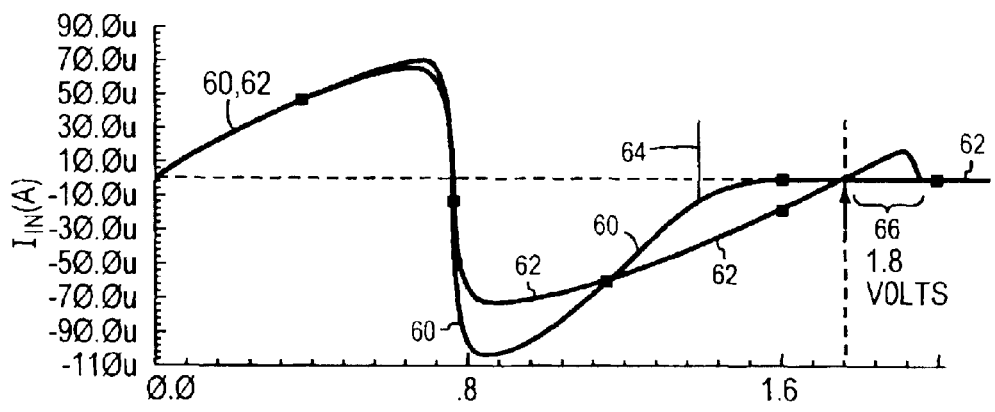
FIG. 6 is an input current versus voltage trace comparing the prior art Nguyen circuit and the present invention.

FIG. 6 compares Iin and Vin for the circuit of Nguyen 60 and the inventive circuit 62 with Vcc at +1.8V. The Nguyen circuit does not exhibit the leakage path of the circuit in FIG. 1. However, when Vin approaches within about 0.5V of Vcc, Iin 60 approaches zero 64. This is the zone where Nguyen's circuit loses its drive, due to the diodes discussed above, and exhibits unacceptable asymmetrical input/output behavior. The inventive circuit shows no such characteristic and operates well up through to where Vin exceeds Vcc 66. Also, notice the symmetry of the inventive circuit curve 62 traversing from Vin from 0 to 1.8V compared to the unsymmetry 60 of Nguyen circuit.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A CMOS bus hold circuit defining an input and an output, the bus hold circuit powered from a positive power rail, Vcc, the bus hold circuit comprising:
   a first inverter receiving an input signal, Vin, at the input and providing its complement at the output,
   an arbiter circuit arranged to selectively connect the more positive of Vin or Vcc to a pseudo power rail or prail,
   a second inverter receiving the output and providing its complement back to the input thereby latching or holding the logic state of Vin, the second inverter defining a power connection,
   a PMOS transistor arranged, when on, to connect the power connection to Vcc, and when off to disconnect the second inverter from Vcc, thereby allowing the power connection to float, and where the PMOS N-well is connected to the prail, thereby preventing the PMOS drain to N-well from being forward biased,
   a comparator circuit arranged to receive and compare Vin to Vcc, and provide a control signal equal to Vin when the Vin is higher than Vcc, and to disconnect the control signal, allowing it to float, when Vcc is higher than Vin, and
   a switch that is on and pulls the control signal low when Vin is a logic low, and where the switch is off when Vin is not a logic low,
   wherein the bus hold circuit draws no DC current, and where when Vin is higher than Vcc no leakage current is drawn from Vin.

2. The bus hold circuit of claim 1 wherein the arbiter circuit comprises two PMOS transistors with their drains and N-wells connected together.

3. The bus hold circuit of claim 1 wherein the switch is a PMOS transistor with its gate connected to Vin and its source connected to the control signal.

4. A computer system including one or more of the bus hold circuits defined in claim 1.

5. The bus hold circuit of claim 1 wherein the comparator comprises:
   a first PMOS with its source connected to Vin and its gate connected to Vcc,
   a second PMOS with its source connected to the drain of the first PMOS and its gate connected to Vcc, and its drain connected to the control signal,
   a third PMOS with its source connected to the source of the second PMOS and its gate connected to Vin,
   wherein the N-wells of the first, second, and third PMOS transistors are all connected to the prail,
   a first NMOS with its drain connected to the drain of the second PMOS and its source connected to a power return,
   a second NMOS with its drain connected to the drain of the third PMOS, its gate connected to its drain and to the gate of the first NMOS, and its source connected to the power return, wherein the first, second, and third PMOS transistors and the first and second NMOS transistors form a comparator circuit wherein the control signal is connected to Vin when Vin is higher the Vcc, and where the control signal is unconnected and floats when Vcc is higher than Vin, and further wherein the comparator uncertainty when Vin and Vcc are near each other is limited to differential of about 100 millivolts.

6. A bus hold circuit defining an input and an output, the bus hold circuit powered from a positive power rail, Vcc, the bus hold circuit comprising:
   means for receiving an input signal, Vin, at the input and providing its complement at the output,
   means to selectively connect the more positive of Vin or Vcc to a pseudo power rail or prail,
   inverter means for receiving the output and providing its complement back to the input thereby latching or holding the logic state of Vin,
   means for connecting and disconnecting the inverter means to Vcc, wherein when disconnected the inverter means floats,
   means for comparing Vin to Vcc, and for providing a control signal equal to Vin when the Vin is higher than Vcc, and for disconnecting the control signal, allowing it to float, when Vcc is higher than Vin, and
   means for pulling the control signal low when Vin is a logic low,
   wherein the bus hold circuit draws no DC current, and when Vin is higher than Vcc no leakage current is drawn from Vin.

7. A process for holding an input bus signal and outputting the signal or its complement, the process comprising the steps of:
   receiving an input signal, Vin, at an input and providing its complement,
   selectively connect the more positive of Vin or Vcc to a pseudo power rail or prail,
   receiving the output and providing its complement back to the input thereby defining an inverter for latching or holding the logic state of Vin,
   connecting and disconnecting the inverter to Vcc, wherein when disconnected the inverter means floats,
   comparing Vin to Vcc, and providing a control signal equal to Vin when the Vin is higher than Vcc, and for disconnecting the control signal, allowing it to float, when Vcc is higher than Vin, and
   pulling the control signal low when Vin is a logic low,
   configuring the process to draw no DC current and no leakage current when Vin is higher than Vcc.

* * * * *